United States Patent
Wei

(10) Patent No.: US 7,173,817 B2
(45) Date of Patent: Feb. 6, 2007

(54) FRONT SIDE HOT-SWAP CHASSIS MANAGEMENT MODULE

(75) Inventor: Wen Wei, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 216 days.

(21) Appl. No.: 10/748,385

(22) Filed: Dec. 29, 2003

(65) Prior Publication Data

US 2005/0068722 A1  Mar. 31, 2005

Related U.S. Application Data

(60) Provisional application No. 60/507,219, filed on Sep. 29, 2003.

(51) Int. Cl.
*H05K 1/16* (2006.01)

(52) U.S. Cl. .............. 361/686; 361/752; 361/790; 361/701

(58) Field of Classification Search ............. 361/752, 361/797, 800, 796, 686, 756, 801, 683, 730
See application file for complete search history.

(56) References Cited

U.S. PATENT DOCUMENTS

| | | | | |
|---|---|---|---|---|
| 5,216,579 A | * | 6/1993 | Basara et al. ............ | 361/683 |
| 6,222,729 B1 | * | 4/2001 | Yoshikawa ................ | 361/695 |
| 6,278,608 B1 | * | 8/2001 | Ater et al. ................ | 361/695 |
| 6,483,700 B1 | * | 11/2002 | Malone et al. ............ | 361/690 |
| 6,499,609 B2 | * | 12/2002 | Patriche et al. ............ | 211/175 |
| 6,904,968 B2 | * | 6/2005 | Beitelmal et al. .......... | 165/247 |
| 2002/0149911 A1 | * | 10/2002 | Bishop et al. ............. | 361/690 |
| 2003/0235042 A1 | * | 12/2003 | Harris et al. ............... | 361/752 |
| 2005/0071689 A1 | * | 3/2005 | Coward et al. ............ | 713/300 |

OTHER PUBLICATIONS

Advanced TCA™, PICMG® 3.0 Revision 1.0, Advanced TCA™ Base Specification, Dec. 30, 2002, pp. i-414.
Release Notes, PICMG ECN 3.0-1.0-001, Feb. 17, 2004, pp. 1-4, with AdvancedTCA®, PICMG Specification, Engineering Change Notice 3.0-1.0-001, Jan. 14, 2004, Affected Specification: PICMG 3.0 R1.0, pp. i-D-12.

* cited by examiner

*Primary Examiner*—Tuan Dinh
*Assistant Examiner*—Hung S. Bui
(74) *Attorney, Agent, or Firm*—Schwabe, Williamson & Wyatt, P.C.

(57) ABSTRACT

A modular platform is provided. The modular platform includes a chassis having a front side and a back side, and configured to receive modular platform boards, a plenum associated with the chassis and at least one chassis management module removably disposed in the at least one plenum in a substantially parallel relationship with a flow of a cooling medium passing through the plenum.

8 Claims, 3 Drawing Sheets

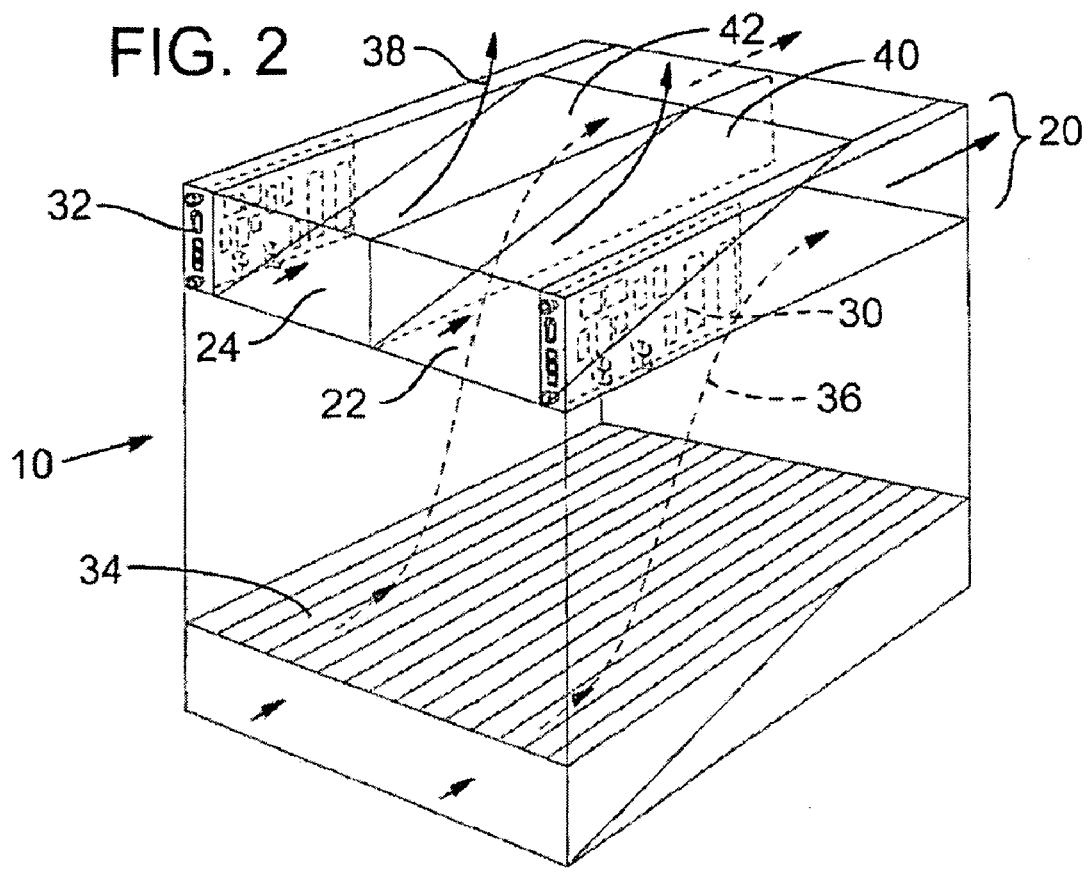
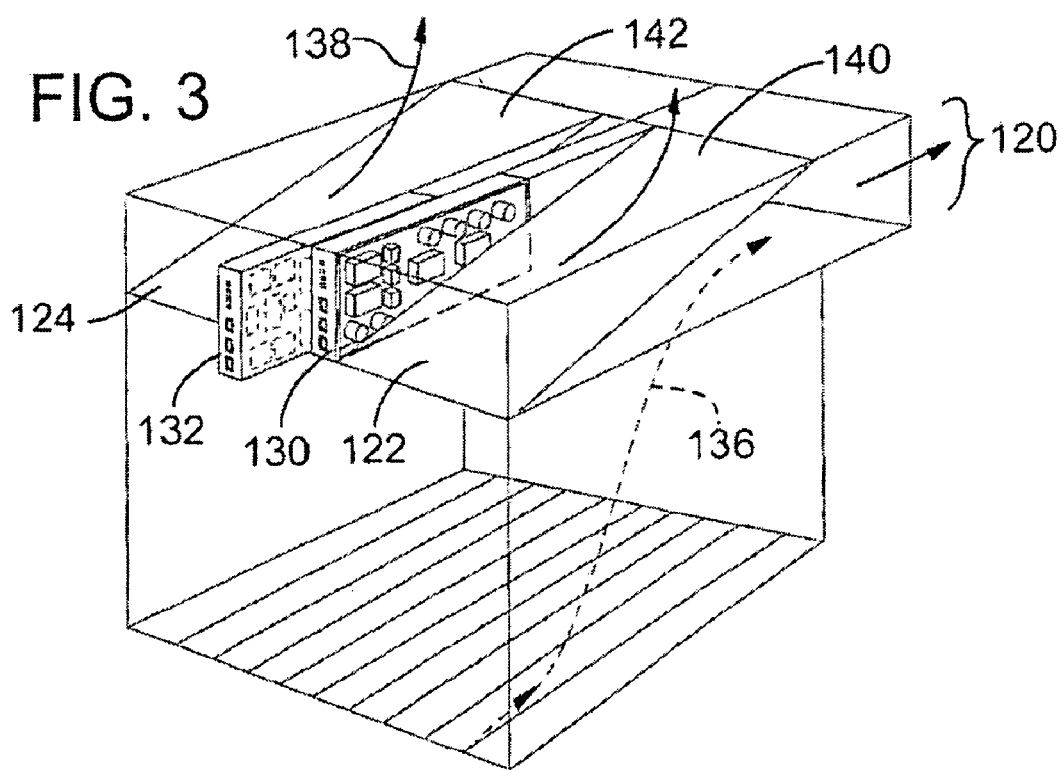

FRONT SIDE HOT-SWAP CHASSIS MANAGEMENT MODULE

RELATED APPLICATIONS

This application claims the benefit of U.S. Provisional Application No. 60/507,219, filed on Sep. 29, 2003.

FIELD OF THE INVENTION

Embodiments of the invention generally relate to modular computing systems, such as, systems in accordance or in compliance with the specification of the Advanced Telecom Computing Architecture (ATCA). More specifically, disclosed embodiments of the invention relate to chassis management module configurations to enhance modular platform cooling and maximizing use of space.

BRIEF DESCRIPTION OF THE DRAWINGS

The invention is illustrated by way of example and not by way of limitation in the figures of the accompanying drawings, in which the like references indicate similar elements and in which:

FIG. 2 illustrates a front/side perspective view of the modular platform of FIG. 1 in accordance with an embodiment of the present invention;

FIG. 3 illustrates a front/side perspective view of a modular platform in accordance with an embodiment of the present invention.

DETAILED DESCRIPTION OF EMBODIMENTS OF THE INVENTION

Figure 1:
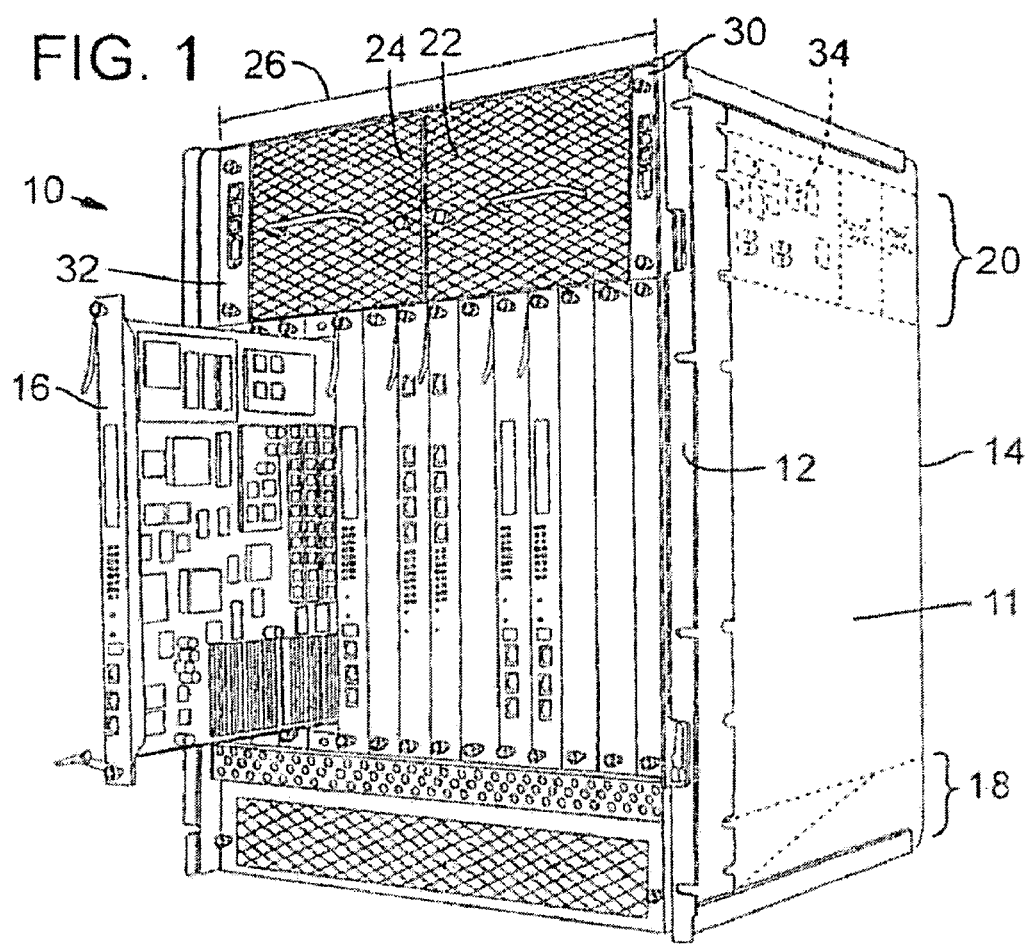
FIG. 1 illustrates a front/side perspective view of a modular platform in accordance with an embodiment of the present invention.

In the following detailed description, reference is made to the accompanying drawings that form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of the present invention may provide a modular platform having a chassis management module (CMM) that may be configured to resist airflow restriction and may also enable use of a dual plenum design for use in higher density modular platform applications, while retaining front side hot-swappability. In several modular computing applications, such as Advanced Telecom Computing Architecture (ATCA) and Flexi-Server applications, where modular platform space may be constrained, strategic configuration of the necessary components to a modular platform is critical to maximize the use of allowable space.

One of the components that many standards and design requirements may require is a CMM. The CMM, which may sometimes be referred to as a shelf management module or system management module, is typically the central point of managing the modular platform as a single unit. The CMM may monitor, control, and ensure proper operation of the modular platform. The CMM may be responsible for monitoring the health of the system, report issues, and take corrective actions as needed, such as power cycling, notification of fan or power module failure and the like.

One such standard is the PCI Industrial Computer Manufacturers Group (PICMG) 3.0 ATCA Specification (ATCA Specification), which is targeted to the next generation of carrier grade communication equipment. The ATCA specification requires, for example, that the CMM monitor and control shelf modules such as modular platform boards, fan modules, power entry modules and the like.

In current modular platforms, CMMs are typically redundant and located in an exhaust plenum, which is responsible for diverting a cooling medium out the back side of a modular platform after the cooling medium has passed over and cooled the modular platform boards. The CMMs in such modular platforms are positioned in a generally flat horizontal position on the upper portion of the plenum. This configuration may be sufficient where the cooling medium need not pass through the upper portion of the plenum, as may be the case in a standard 12 U and 14 U shelf used in ATCA applications.

However, where it is desirable to have the cooling medium pass through the upper portion of the plenum, as may be the case, for example, in a shared plenum where the forward portion is an intake plenum for an upper modular platform and the rear portion acts as the exhaust plenum for a lower modular platform, the CMMs may restrict or completely block the cooling medium flow to the upper modular platform. One such example where a shared plenum may be used is in a 10 U shelf form factor used in ATCA applications and disclosed in co-pending Provisional Application No. 60/519,194, filed on Nov. 11, 2003. Embodiments in accordance with the present invention provide plenum and CMM configurations that may not restrict airflow to an adjacent modular platform and provide for a better cooling solution for the CMMs.

FIG. 1 illustrates a front/side perspective view of a modular platform 10 in accordance with an embodiment of the present invention. Modular platform 10 may include a chassis 11, which may have a front side 12 and a rear side 14. Chassis 11 may be configured to receive a plurality of modular platform boards 16, which may be removably inserted into slots (not shown) from the front side 12. Modular platform board 16, such as an ATCA blade, may contain several heat generating electronic components, including, but not limited to, semiconductor devices like microprocessors, memory and the like, a host of supporting electronic components such as capacitors, diodes, transistors, and the like, and cards or other supporting modules.

To affirmatively manage the heat generated by the modular platform boards 16, modular platform 10 may also include, or be coupled to, an intake plenum 18 and an exhaust plenum 20. A cooling medium, such as air, may be pulled through the intake plenum 18, past the modular platform boards 16 and out again through exhaust plenum 20. In doing so, heat generated from the modular platform boards 16 may be transferred to the passing cooling medium through forced convection.

CMMs 30, 32 may be used to orchestrate the interaction of the various modular platform components, by monitoring, controlling, and ensuring proper operation of such components. Dimensional requirements of many standards result in placement of the CMMs away from the array of modular platform boards 16. Accordingly, the CMMs 30, 32 may be positioned in the exhaust plenum 20 in a configuration that is generally parallel in plane to the flow of the cooling medium passing through the modular platform. Removable fan modules 22, 24 may also be inserted in plenum 20, and include fans (not shown) to promote ventilation through the modular platform 10.

FIG. 2 illustrates a side perspective view of the modular platform of FIG. 1 in accordance with an embodiment of the present invention. As presented, much of the outer shell of the modular platform 10 has been removed, as well as the modular platform boards, for illustration purposes. CMMs 30, 32 may be redundant and include a variety of electronic components, such as semiconductor devices and the like.

Plenum 20 may be a dual plenum, where it may act as both an intake for an upper or adjacent modular platform (not shown) and an exhaust for a lower or oppositely adjacent modular platform. Dual plenums may be used to maximize space reduction in stacking of multiple modular platforms. Baffles 40, 42 may be incorporated in fan modules 22, 24, respectively, to configure plenum 20 as a dual plenum.

To prevent restriction of airflow, to an adjacent modular platform, CMMs 30, 32 may be removably configured to engage the plenum 20 at the outer portions of fan modules 22, 24 in a generally parallel planar orientation with the airflow 36 passing through the modular platform and airflow 38 passing through the intake portion of plenum 20. As shown, the CMMs 30, 32 are positioned in a generally vertical configuration such that air passing through the forward portion of the fan module trays in the plenum 20 can be diverted upward without being obstructed by the CMMs 30, 32.

Many specifications, such as the ATCA Specification, require that both the CMMs and the fan modules be front side accessible and front side removable. This is for both operator convenience as well as restrictions on access to the rear of a rack of modular platforms. Referring back to FIG. 1, CMM 30 may be part of a fan module 22 and CMM 32 may be part of fan module 24, such that front side removal of either fan module 22, 24 may result in removal of CMM 30, 32, respectively. The CMMs 30, 32 may also be independent of fan modules 22, 24, such that either CMM may be independently front side removed from the fan modules 22, 24 and plenum 20, to enable changing of a CMM without significantly altering the ventilation capacity of the modular platform. Likewise, the fan modules 22, 24 may be removed without removing the CMMs 30, 32, in the event that a malfunction occurs in a fan module that requires replacement of that fan module.

The aggregate width of fan modules 22, 24 and CMMs 30, 32 may be less than a specification required aggregate width 26. For example, the ATCA specification requires that the width of a modular platform, and thus the aggregate width 26 must be less than or equal to 440 mm, to enable the modular platform 10 to fit within an existing rack. Whether CMMs 30, 32 are part of fan modules 22, 24 or independent therefrom, the aggregate width 26 may be less than that specified by the specification.

FIG. 3 illustrates a front/side perspective view of a modular platform in accordance with an embodiment of the present invention. CMMs 130, 132 are removably disposed in plenum 120 between fan modules 122, 124, which are in a dual plenum configuration. CMMs 130, 132 are configured generally in a parallel planar relationship to the airflow 136 passing through the exhaust or lower portion of fan modules 122, 124, and airflow 138 passing through the intake or upper portion of fan modules 122, 124. Being generally vertical, CMMs 130, 132 may not significantly restrict the airflow 138 passing through the intake portion of fan modules 122, 124.

Further, as configured, the heat generating electronic components mounted on the CMMs 122, 124 may be cooled by the passing air 136 or 138. CMMs 130, 132 may be independent from or a part of the fan modules 122, 124, and may also be independently removable from the modular platform without removing a corresponding fan module. When using the center CMM configuration, the modular platform boards directly beneath, may need to be low power boards, such as a switch board, as airflow over those boards may be less than airflow outside the area directly below the CMMs.

Many specifications require modular platforms to be constrained to certain dimensional requirements, such as height, width, and length. In the ATCA Specification, for example, the size of the modular platforms are regulated, either directly or indirectly. One of most critical dimensions is the height of the modular platform, including the intake and exhaust plenums. In legacy Telco systems, the racks that are currently used and with which the next generation modular platforms may be used, are generally 42 U–45 U in height, where 1 U equals approximately 44 mm. Accordingly, to maximize density and get as much computing power as possible in these existing racks, the height of each modular platform is critical.

The ATCA specification requires the portion of the modular platform that receives the modular platform board be about 8 U. Using dual plenums and configuring the CMMs in accordance with embodiments of the present invention enable substantial improvements in the use of space in the existing racks and a more efficient high-density solution.

Figure 4:
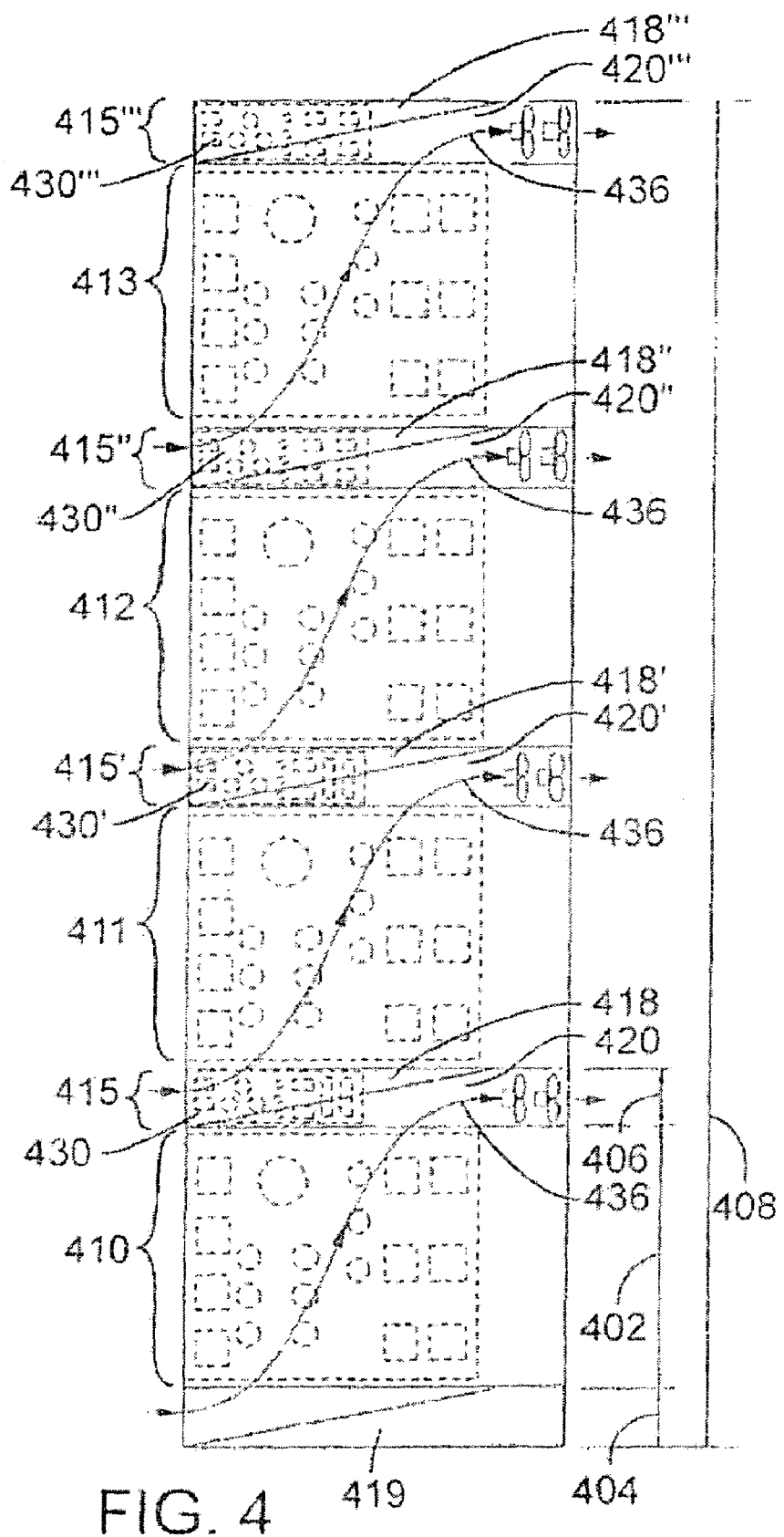
FIG. 4 illustrates a cross-sectional view of multiple modular platforms in accordance with an embodiment of the present invention.

FIG. 4 illustrates a cross-sectional view of multiple modular platforms in accordance with an embodiment of the present invention. Four modular platforms 410, 411, 412, 413 are vertically stacked. Each modular platform 410, 411, 412, 413 may be coupled to a dual plenum, 415, 415', 415", 415''', respectively. The dual plenums each may have an intake portion 418, 418', 418", 418''' and an exhaust portion 420, 420', 420", 420'''. It can be appreciated that intake portion 418''' need not be present if the modular platform 413 is the top unit. A single plenum may be used instead. Further, the bottom plenum 419 in a rack may be a dual plenum, but the exhaust portion would not be necessary. Accordingly, a single plenum could also be used for the bottom plenum if desired.

CMMs 430, 430', 430", 430''' are positioned parallel in plane to the airflow 436 through each modular platform. So positioned, CMMs 430, 430', 430", 430''' do not restrict or significantly block the airflow 436 in through an intake portion 418, 418', 418". This configuration may allow the dual plenums 415, 415', 415", 415''' to be used and thus eliminate unnecessary single plenums that take up additional unnecessary space.

Where the modular platform board receiving portion of a modular platform has a height 402 of 8 U, providing a dual plenum height 406 of 2 U that is shared between adjacent modular platforms, may enable up to four modular platforms to be stacked in a standard rack having a rack height 408 of 42 U. This is a significant improvement over current modular platforms, which are typically 12 U and 14 U with independent intake and exhaust plenums. A more dense stack has not been previously achievable due in part to the CMMs constricting airflow. In the 12 U and 14 U modular platforms, then only three or fewer modular platforms may be inserted in an existing 42 U rack. Using CMM configurations in accordance with embodiments of the present invention may enable the high-density stacking of up to four modular platforms per 42 U rack.

Though not shown, embodiments in accordance with the present invention also include configuring the CMMs in a parallel planar relationship to the airflow where a single fan module is used, or where more than two fan modules are used. Additional embodiments in accordance with the present invention also include positioning the CMMs in a vertical relationship in single plenums (not shared), which may result in a more effective cooling of the CMM since the air may pass over both sides of the CMMs. Also, it can be appreciated that the CMM and plenum configuration in accordance with embodiments of the present invention may also be used in the intake plenum, where only a single plenum is used.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A modular platform, comprising:
 a chassis having a front side and a back side, and configured to receive modular platform boards;
 a plenum associated with the chassis; and
 at least one chassis management module designed to at least partially control and at least partially ensure proper operation of the modular platform boards and to be removably disposed in the at least one plenum in a substantially parallel relationship with a flow of a cooling medium passing through the plenum; and
 wherein the plenum is a dual plenum and the chassis management module is positioned substantially vertical in the dual plenum.

2. The modular platform of claim 1, wherein the dual plenum includes two or more fan modules that are independently removable from the plenum.

3. The modular platform of claim 2, wherein the chassis management module is vertically positioned about an outer edge of at least one of the fan modules, and independently removable from the at least one fan module.

4. The modular platform of claim 2, wherein the chassis management module is vertically positioned between at least two fan modules, and independently removable from the at least two fan modules.

5. A system comprising,
 a rack; and
 a plurality of modular platforms mounted in the rack, at least one of the modular platforms including
 a chassis having a front side and a back side, and configured to receive modular platform boards,
 a plenum associated with the chassis, and
 at least one chassis management module designed to at least partially control and at least partially ensure proper operation of the modular platform boards and to be removably disposed in the at least one plenum in a substantially parallel relationship with a flow of a cooling medium passing through the plenum; and
 wherein the plenum is a dual plenum and the chassis management module is positioned substantially vertical in the dual plenum.

6. The system of claim 5, wherein the dual plenum includes two or more fan modules that are independently removable from the plenum.

7. The system of claim 6, wherein the chassis management module is vertically positioned about an outer edge of at least one of the fan modules, and independently removable from the at least one fan module.

8. The system of claim 6, wherein the chassis management module is vertically positioned between at least two fan modules, and independently removable from the at least two fan modules.

* * * * *